United States Patent
Shiraishi et al.

(10) Patent No.: US 7,989,927 B2
(45) Date of Patent: Aug. 2, 2011

(54) SILICON SUBSTRATE FOR PACKAGE

(75) Inventors: Akinori Shiraishi, Nagano (JP); Kei Murayama, Nagano (JP); Yuichi Taguchi, Nagano (JP); Masahiro Sunohara, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 239 days.

(21) Appl. No.: 12/257,626

(22) Filed: Oct. 24, 2008

(65) Prior Publication Data
US 2009/0108411 A1 Apr. 30, 2009

(30) Foreign Application Priority Data

Oct. 29, 2007 (JP) ................. 2007-280695

(51) Int. Cl.
*H01L 23/49* (2006.01)
(52) U.S. Cl. ...................................................... 257/621
(58) Field of Classification Search ............ 257/79–103, 257/41, 734–786, 177–182, 276, 457, 459, 257/502, 503, 573, 584, 602, 621, 664–677, 257/116, 117, 432–437, E23.01–E33.059; 438/25–28
See application file for complete search history.

(56) References Cited

U.S. PATENT DOCUMENTS

| | | | | |
|---|---|---|---|---|
| 6,888,209 B2 * | 5/2005 | Jobetto | ........................ | 257/459 |
| 7,081,665 B2 * | 7/2006 | Wood et al. | ................... | 257/621 |
| 7,750,358 B2 * | 7/2010 | Shiraishi et al. | ................ | 257/98 |
| 2007/0018190 A1 * | 1/2007 | Kim et al. | ........................ | 257/99 |
| 2008/0136022 A1 * | 6/2008 | Filoteo et al. | ................. | 257/737 |
| 2008/0136038 A1 * | 6/2008 | Savastiouk et al. | ........... | 257/774 |

FOREIGN PATENT DOCUMENTS

JP 2007-208041 8/2007

* cited by examiner

*Primary Examiner* — Dao H Nguyen
*Assistant Examiner* — Tram H Nguyen
(74) *Attorney, Agent, or Firm* — Rankin, Hill & Clark LLP

(57) ABSTRACT

In a silicon substrate for a package, a through electrode is provided with which a through hole passing through from a bottom surface of a cavity for accommodating a chip of an electronic device to a back surface of the substrate is filled. An end part of the through electrode in the bottom surface side of the cavity has a connection part to a wiring that forms an electric circuit including the chip of the electronic device. The silicon substrate for a package is characterized in that (1) a thin film wiring is included as the wiring and the connection part is reinforced by a conductor connected to the thin film wiring and/or (2) a wire bonding part is included as the wiring and the connection part is formed by wire bonding the end part of the through electrode in the bottom surface side of the cavity.

6 Claims, 4 Drawing Sheets

FIG. 1 (1)
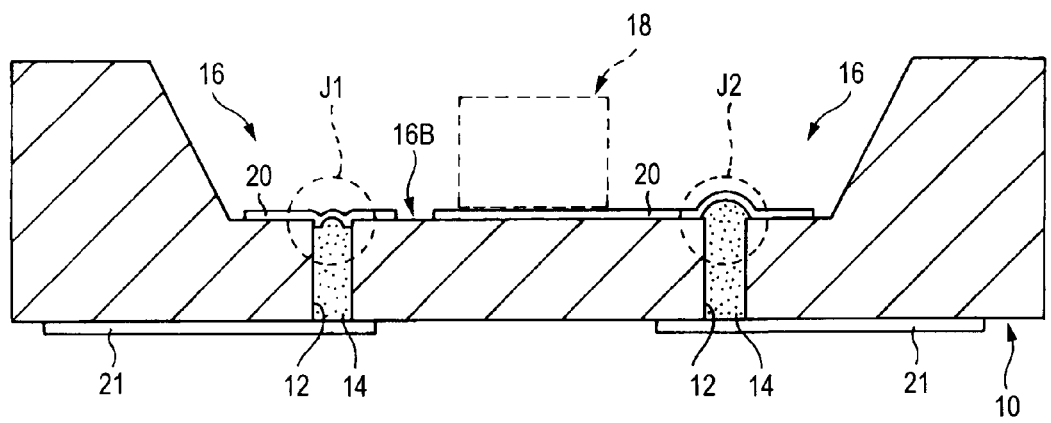
FIG. 1 (2)
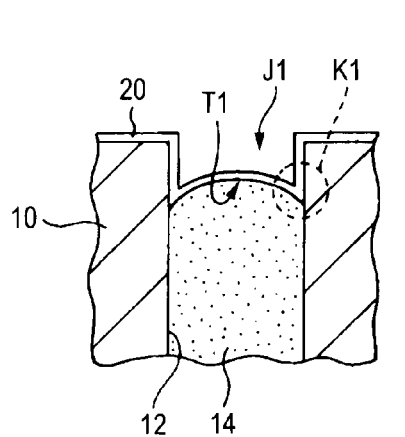
FIG. 1 (3)
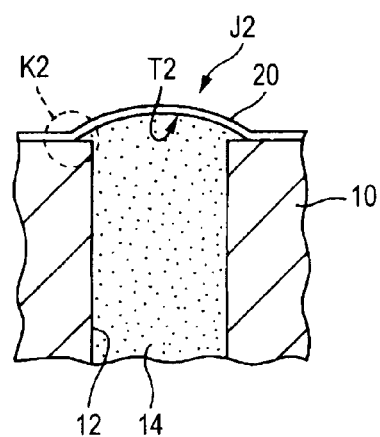

FIG. 2 (1)
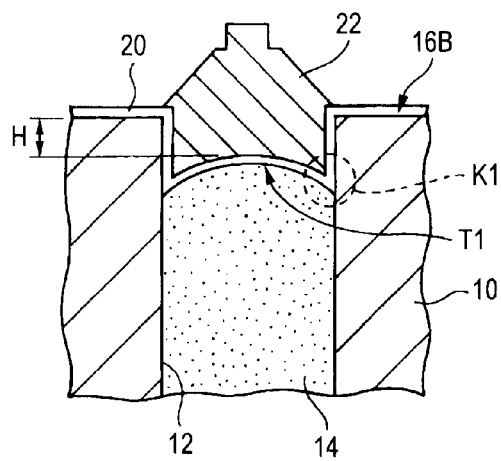
FIG. 2A
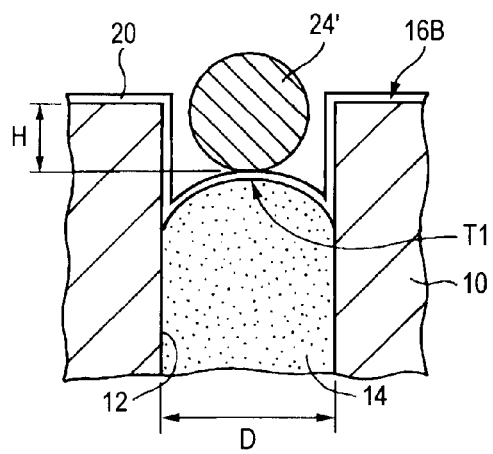
FIG. 2B
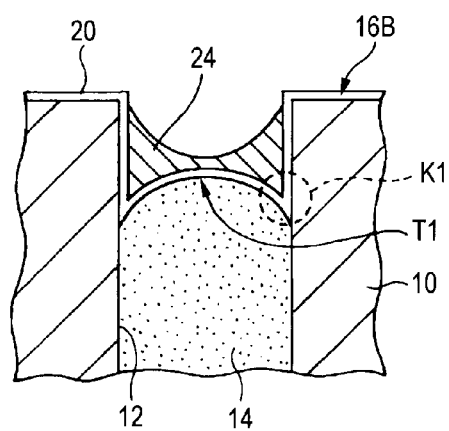

FIG. 3 (1)
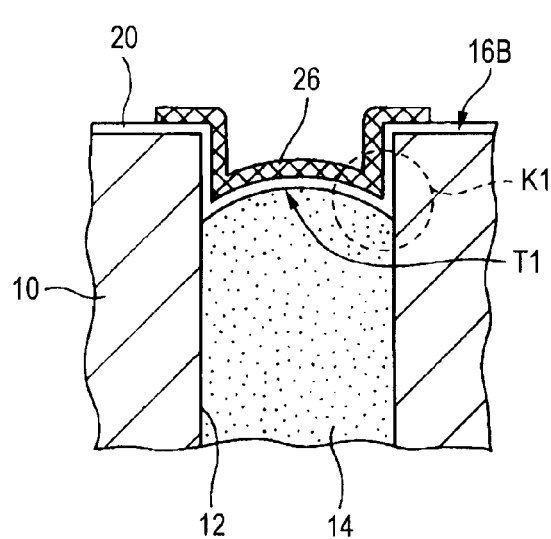
FIG. 3 (2)
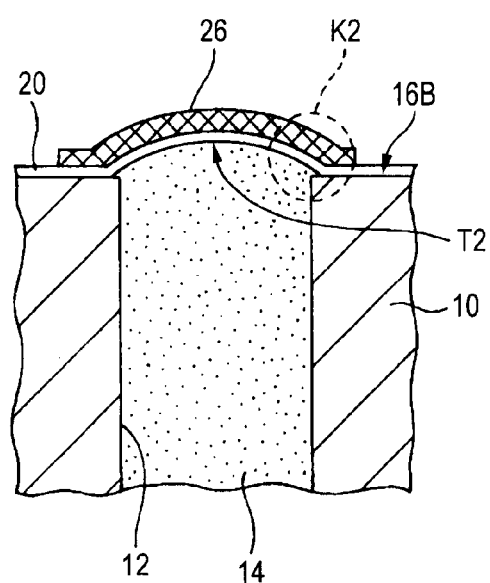

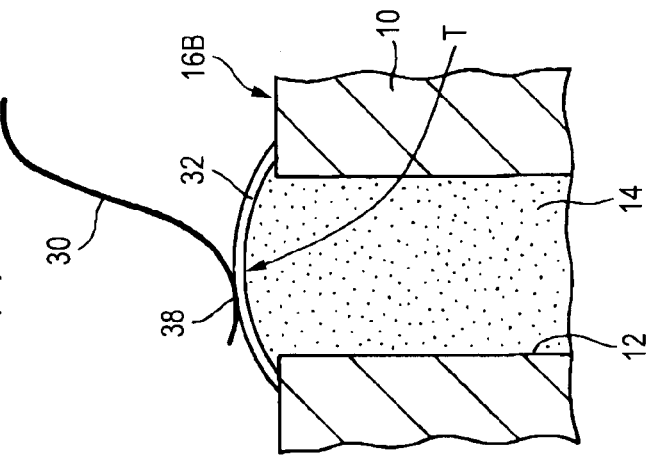
FIG. 4 (1)
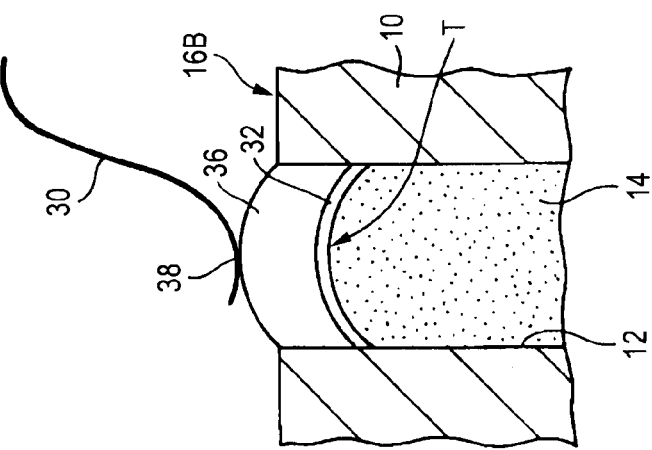
FIG. 4 (2)
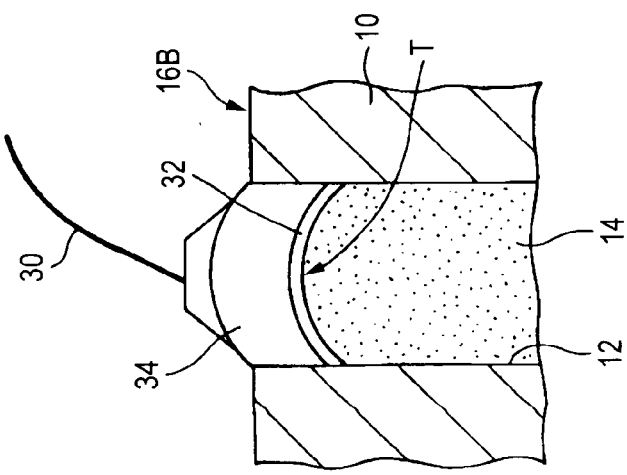
FIG. 4 (3)

SILICON SUBSTRATE FOR PACKAGE

BACKGROUND OF THE INVENTION

The present invention relates to a silicon substrate for a package and more particularly to a silicon substrate for a package having a cavity for accommodating a chip for an electronic device.

To advance the miniaturization and the reduced thickness of various kinds of electronic devices using a semiconductor device, a semiconductor package used for the semiconductor device needs to meet the miniaturization and the reduced thickness. Especially, to reduce the thickness, a silicon substrate for a package having a cavity is used (for instance, Patent Document 1). Namely, in the cavities dug from the surface of the substrate by etching, chips of the electronic devices such as a laser diode (LD), a photodiode (PD), a light emitting diode (LED), a micro-electro mechanical system (MEMS) or the like are mounted to absorb a part or all of the height of the chips of the electronic devices and reduce the thickness of the package. Thus, the package whose thickness is reduced in accordance with a specification requested by a client can be provided by using an ordinarily marketed silicon wafer whose selection of the thickness is limited to a range of a standard.

As shown in FIG. 1(1), a through electrode 14 formed by filling a through hole 12 that passes through a silicon substrate 10 in the direction of a thickness with a plating functions as a lead-out line to an external part from a terminal of an electronic device chip 18 mounted in a cavity 16. A thin film wiring 20 formed on a bottom surface 16B of the cavity by sputtering or a deposition that includes connection parts J1 and J2 to the through electrode 14 is patterned. In an external exposed end of the through electrode 14, a back wiring 21 including a pad for mounting the package on a motherboard is formed.

As shown in FIGS. 1(2) and 1(3), end parts T1 and T2 of the through electrode 14 formed in the cavity 16 by plating is recessed into the through hole 12 (T1) or, on the contrary, protrudes from the bottom surface 16B of the cavity (T2) within an allowable range of a forming process. However, since a flattening process by polishing cannot be not applied to the bottom surface 16B of the cavity, the thin film wiring 20 needs to be formed on the end parts T1 and T2 of the through electrode under a state that the irregularities of the end parts T1 and T2 of the through electrode are left.

As shown in FIG. 1(2), in the case of the connection part J1 under a state that the end part T1 of the through electrode is recessed into the through hole 12 from the bottom surface 16B of the cavity, since an accumulation is little formed by sputtering or the deposition in a corner part K1 formed by the end part T1 and the side wall of the through hole 12, the thickness of the thin film wiring 20 is small, so that a disconnection is liable to arise.

Further, as shown in FIG. 1(3), in the case of the connection part J2 under a state that the end part T2 of the through electrode protrudes from the bottom surface 16B of the cavity, a distortion due to a differential thermal expansion between a material of the through electrode and the silicon substrate is concentrated on a part K2 in which the end part T2 protrudes in the form of a shade in the peripheral edge of the opening of the through hole 12, so that a disconnection is liable to arise.

As described above, a problem usually arises that in the connection parts J1 and J2 of the through electrode 14 and the thin film wiring 20 in the bottom surface 16B of the cavity, the disconnection is liable to occur.

[Patent Document 1] JP-A-2007-208041

It is an object to provide a silicon substrate for a package that prevents a disconnection between a through electrode and a thin film wiring in the bottom surface of a cavity from arising.

In order to achieve the above-described object, according to a first aspect, there is provided a silicon substrate for a package including:

a through electrode which fills a through hole passing through from a bottom surface of a cavity for accommodating a chip of an electronic device to a back surface of the substrate;

an end part of the through electrode in a bottom surface side of the cavity having a connection part to a wiring that forms an electric circuit including the chip of the electronic device; and (1) a thin film wiring as the wiring, wherein the connection part is reinforced by a conductor connected to the thin film wiring.

According to a second aspect of the invention, there is provided the silicon substrate for a package according to the first aspect, wherein the end part of the through electrode in the bottom surface side of the cavity is located at a position lower than the bottom surface of the cavity, and a metal bump which fills a space in the through hole to the end part from the bottom surface of the cavity and is connected to the thin film wiring or a solder re-flow part forms the conductor.

According to a third aspect of the invention, there is provided the silicon substrate for a package according to the first aspect, wherein the conductor is formed by a thick film wiring connected to the end part of the through electrode in the bottom surface side of the cavity and the thin film wiring in the periphery thereof.

According to a forth aspect of the invention, there is provided a silicon substrate for a package including:

a through electrode which fills a through hole passing through from a bottom surface of a cavity for accommodating a chip of an electronic device to a back surface of the substrate;

an end part of the through electrode in a bottom surface side of the cavity having a connection part to a wiring that forms an electric circuit including the chip of the electronic device; and (2) a wire bonding part as the wiring, wherein the connection part is formed by wire bonding the end part of the through electrode in the bottom surface side of the cavity.

According to a fifth aspect of the invention, there is provided the silicon substrate for a package according to the forth aspect, wherein the end part of the through electrode in the bottom surface side of the cavity is located at a position lower than the bottom surface of the cavity, and the connection part is formed by a first bonding part which fills a space in the upper part of the end part in the through hole and is connected to the end part.

According to a sixth aspect of the invention, there is provided the silicon substrate for a package according to the forth aspect, wherein the end part of the through electrode in the bottom surface side of the cavity is located at a position lower than the bottom surface of the cavity, and the connection part is formed by a second bonding part connected to the upper end of a metal bump which fills a space in the upper part of the end part in the through hole.

According to a seventh aspect, there is provided the silicon substrate for a package according to the forth aspect, wherein the end part of the through electrode in the bottom surface side of the cavity is located at a position higher than the bottom surface of the cavity, and the connection part is formed by a second bonding part connected to the end part.

In the present invention, the connection part is reinforced by the conductor connected to the thin film wiring and/or (2) the connection part is formed by wire bonding the end part of the through electrode in the bottom surface side of the cavity. Thus, a disconnection in the connection part can be prevented.

BRIEF DESCRIPTION OF THE DRAWINGS

FIGS. 1(1) to 1(3) are sectional views of a usual silicon substrate for a package.

FIGS. 2(1), 2A and 2B are sectional views of a connection part of a silicon substrate for a package according to a first embodiment of the present invention.

FIGS. 3(1) and 3(2) are sectional views of a connection part of a silicon substrate for a package according to a second embodiment of the present invention.

FIGS. 4(1) to 4(3) are sectional views of a connection part of a silicon substrate for a package according to a third embodiment of the present invention.

DETAILED DESCRIPTION OF THE PREFERRED EMBODIMENTS

First Embodiment

FIGS. 2(1), 2A and 2B show connection part of a silicon substrate for a package according to one embodiment of the present invention. An illustrated silicon substrate 10 is provided with a cavity 16 similarly to the silicon substrate 10 shown in FIG. 1(1), and, the present invention is applied to a connection part of a through electrode 14 in the cavity 16 and a wiring.

In the connection part shown in FIG. 2(1), an end part T1 of the through electrode 14 in the bottom surface 16B side of the cavity is located at a position lower than that of the bottom surface 16B of the cavity. A depth H from the bottom surface 16B of the cavity to the end part T1 of the through electrode is, for instance, about 20 μm. A thin film wiring 20 is formed so as to continuously cover a part to the end part T1 of the through electrode 14 from the bottom surface 16B of the cavity through an inner wall of a through hole 12. A space in the through hole 12 from the bottom surface 16B to the end part T1 of the through electrode is filled with a metal bump 22 formed by a first bonding of a wire bonding and the metal bump 22 is connected to the thin film wiring 20 to form an integral conductor. The conductor reinforces the connection part of the end part T1 of the through electrode and the thin film wiring 20.

The thin film wiring 20 is formed with PVD or the like to have the thickness of about 1 μm or less. Since thickness of the thin film wiring is reduced especially in a corner part K1, a mechanical strength is extremely lowered, so that a disconnection in the corner part K1 has been hitherto apt to arise.

In the connection part shown in FIG. 2(1), since the through hole 12 in the upper part of the end part T1 of the through electrode is filled with the metal bump 22 by the first bonding and the metal bump 22 is firmly connected to the thin film wiring 20, an extremely higher mechanical strength can be obtained than that of the usual connection part (FIG. 1(2)) formed with only the thin film wiring 20. Thus, a sufficient mechanical strength can be ensured especially also in the corner part K1 and the generation of the disconnection can be prevented.

In a connection part shown in FIGS. 2A and 2B, the end part T1 of a through electrode 14 in the bottom surface 16B side of a cavity is located at a position lower than that of the bottom surface 16B of the cavity like the connection part shown in FIG. 2(1). A thin film wiring 20 is formed so as to continuously cover a part to the end part T1 of the through electrode 14 from the bottom surface 16B of the cavity through an inner wall of a through hole 12. However, in place of the metal bump 22 shown in FIG. 2(1), in a space in the through hole 12 to the end part T1 of the through electrode from the bottom surface 16B of the cavity, a solder ball 24' is arranged as shown in FIG. 2A. The solder ball is allowed to re-flow to fill the space with a solder re-flow part 24 formed as shown in FIG. 2B and the solder re-flow part 24 is connected to the thin film wiring 20 to form an integral conductor and reinforce the connection part of the end part T1 of the through hole and the thin film wiring part 20 thereby. A diameter d of the solder ball 24', an inside diameter D of the through hole 12 and a depth H from the bottom surface 16B of the cavity to the end part T1 of the through electrode establish a relation represented by d<D and H>d/2.

In the connection part shown in FIG. 2B, since the through hole 12 in the upper part of the end part T1 of the through electrode is filled with the solder re-flow part 24 like the metal bump shown in FIG. 2(1) and the solder re-flow part 24 is firmly connected to the thin film wiring 20, an extremely higher mechanical strength can be obtained than that of the usual connection part (FIG. 1(2)) formed with only the thin film wiring 20. Thus, a sufficient mechanical strength can be ensured especially also in the corner part K1 and the generation of the disconnection can be prevented.

In this embodiment and below-described embodiments, dimensions of parts are respectively designated as described below.

When an ordinarily marketed silicon wafer is employed as the silicon substrate 10, a thickness is predetermined in accordance with a SEMI standard, a JEIDA standard or the like. For instance, the thickness of the wafers of 6 inches, 8 inches and 12 inches is respectively set to 625 μm, 725 μm and 775 μm.

The depth of the cavity 16 dug by etching the silicon substrate 10 using the marketed wafer whose thickness is predetermined as described above is limited in accordance with the standard thickness of the actually used wafer. Further, since the back surface of the wafer is formed in the shape of a matte, a grinding process is necessary. Thus, the thickness of the silicon substrate is more reduced by a ground part. For instance, in the case of the silicon substrate 10 using the 8 inch wafer (a standard thickness of 725 μm), since the thickness is about 650 to 675 μm after the back surface is ground, the depth of the cavity is located within a range of 100 to 600 μm or so.

Second Embodiment

FIGS. 3(1) and 3(2) show connection part of a silicon substrate for a package according to one embodiment of the present invention. An illustrated silicon substrate 10 is provided with a cavity 16 similarly to the silicon substrate 10 shown in FIG. 1(1), and, the present invention is applied to a connection part of a through electrode 14 in the cavity 16 and a wiring.

In the connection part shown in FIG. 3(1), an end part T1 of the through electrode 14 in the bottom surface 16B side of the cavity is located at a position lower than that of the bottom surface 16B of the cavity. In the connection part shown in FIG. 3(2), an end part T2 of the through electrode 14 in the bottom surface 16B side of the cavity is located at a position higher than that of the bottom surface 16B of the cavity. In both cases, a thick film wiring 26 is formed so as to continuously cover the end parts T1 and T2 of the through electrode 14 in the bottom surface 16B side of the cavity and a thin film wiring 20 in the periphery thereof. The thick film wiring 26 is formed with the thickness of 5 to 10 μm by an electroplating process having the thin film wiring 20 as a seed layer to reinforce the connection part of the thin film wiring 20 with the thickness of 1 μm or less and the end parts T1 and T2 of the through electrode.

Since the thick film wiring 26 is firmly connected to the thin film wiring 20, an extremely higher mechanical strength can be obtained than that of the usual connection part (FIG. 1(2)) formed with only the thin film wiring 20. Thus, a sufficient mechanical strength can be ensured especially in a corner part K1 or a shade shaped protruding part K2 and the generation of a disconnection can be prevented.

Third Embodiment

FIGS. 4(1) to 4(3) show connection part of a silicon substrate for a package according to one embodiment of the present invention. An illustrated silicon substrate 10 is provided with a cavity 16 similarly to the silicon substrate 10 shown in FIG. 1(1), and, the present invention is applied to a connection part of a through electrode 14 in the cavity 16 and a wiring.

In the connection part shown in FIGS. 4(1) to 4(3), a wire bonding part 30 is included as the wiring and the connection part is formed by wire bonding an end part T of the through electrode 14 in the bottom surface 16B side of the cavity.

In the connection part shown in FIG. 4(1), the end part T of the through electrode 14 in the bottom surface 16B side of the cavity is located at a position lower than that of the bottom surface 16B of the cavity. The connection part of the wire bonding wiring 30 and the end part T is formed by a first bonding part 34 with which a space in the upper part of the end part T in a through hole 12 is filled and that is connected to the end part T. In this case, before a bonding process, a metal layer 32 made of Ni/Au is formed on the end part T of the through electrode by an electroplating process using a side end part (not shown in the drawing) of the back surface of the substrate as a seed and a first bonding process is carried out thereon.

The other end of the wiring bonding part 30 that is not shown in the drawing is ordinarily connected to an electrode of a chip of an electronic device.

In the connection part shown in FIG. 4(1), since the wiring 30 is firmly connected to the end part T of the through electrode by the first bonding process, there is no fear that the disconnection arises as in the usual connection part.

In the connection part shown in FIG. 4(2), the end part T of the through electrode 14 in the bottom surface 16B side of the cavity is located at a position lower than that of the bottom surface 16B of the cavity similarly to the connection part shown in FIG. 4(1). The connection part of a wire bonding wiring 30 and the end part T is formed by a second bonding part 38 connected to the upper end part of a metal bump 36 with which a space in the upper part of the end part T in a through hole 12 is filled. In this case, the metal bump 36 is formed by initially forming a metal layer made of Ni/Au on the end part T of the through electrode under an electroplating process using a side end part (not shown in the drawing) of the back surface of the substrate as a seed and then electroplating the metal layer with gold.

The other end of the bonding wire 30 that is not shown in the drawing is ordinarily connected to an electrode of a chip of an electronic device.

In the connection part shown in FIG. 4(2), since the wiring 30 is firmly connected to the end part T of the through electrode by the metal layer 32 formed by the electroplating process and the metal bump 36 and a second bonding process to the metal bump 36, there is no fear that the disconnection arises as in the usual connection part.

In the connection part shown in FIG. 4(3), the end part T of the through electrode 14 in the bottom surface 16B side of the cavity is located at a position higher than that of the bottom surface 16B of the cavity. The connection part of a wire bonding wiring 30 and the end part T is formed by a second bonding part 38 connected to the end part T. In this case, before a bonding process, a metal layer 32 made of Ni/Au is formed on the end part T of the through electrode by an electroplating process using a side end part (not shown in the drawing) of the back surface of the substrate as a seed and then a second bonding process is carried out thereon.

The other end of the bonding wire 30 that is not shown in the drawing is ordinarily connected to an electrode of a chip of an electronic device.

In the connection part shown in FIG. 4(3), since the wiring 30 is firmly connected to the end part T of the through electrode by the metal layer 32 formed by the electroplating process and the second bonding process to the metal layer 32, there is no fear that the disconnection arises as in the usual connection part. Besides, the metal bump is made of gold.

According to the present invention, a silicon substrate for a package is provided that prevents a disconnection between a through electrode and a thin film wiring in the bottom surface of a cavity from arising.

What is claimed is:

1. A silicon substrate for a package comprising:
    a through electrode which fills a through hole passing through from a bottom surface of a cavity for accommodating a chip of an electronic device to a back surface of the substrate, the bottom surface of the cavity being positioned lower than a top surface of the substrate outside the cavity;
    an end part of the through electrode in a bottom surface side of the cavity having a connection part to a wiring that forms an electric circuit including the chip of the electronic device;
    a thin film wiring as the wiring, wherein the connection part is reinforced by a conductor connected to the thin film wiring; and
    the conductor is a thick film wiring disposed over the thin film wiring at an area aligned with the electrode and overlying an intersection of the electrode and the substrate, wherein the thin film wiring extends outwardly beyond a periphery of the thick film wiring.

2. The silicon substrate for a package according to claim 1, wherein
    the end part of the through electrode in the bottom surface side of the cavity is located at a position lower than the bottom surface of the cavity, and
    a metal bump which fills a space in the through hole to the end part from the bottom surface of the cavity and is connected to the thin film wiring or a solder re-flow part forms the conductor.

3. The silicon substrate for a package according to claim 1, wherein
    the thick film wiring is connected to the end part of the through electrode in the bottom surface side of the cavity and the thin film wiring in the periphery of the electrode.

4. The silicon substrate for a package according to claim 1, wherein the thick film wiring is at least five times the thickness of the thin film wiring.

5. The silicon substrate for a package according to claim 4, wherein the thick film wiring has a thickness in the range of 5-10 μm, and the thin film wiring has a thickness less than or equal to 1 μm.

6. The silicon substrate for a package according to claim 1, wherein the end part of the through electrode at a side of the bottom surface of the cavity is positioned lower than the bottom surface of the cavity.

\* \* \* \* \*